(12) United States Patent
Reit et al.

(10) Patent No.: US 11,427,684 B2
(45) Date of Patent: Aug. 30, 2022

(54) PHOTOPATTERNED PLANARIZATION LAYERS FOR FLEXIBLE ELECTRONICS

(71) Applicant: Ares Materials Inc., Dallas, TX (US)

(72) Inventors: Radu Reit, Carrollton, TX (US); Adrian Avendano-Bolivar, Plano, TX (US); Apostolos Voutsas, Portland, OR (US); David Arreaga-Salas, Garland, TX (US)

(73) Assignee: Ares Materials, Inc., Dallas, TX (US)

( * ) Notice: Subject to any disclaimer, the term of this patent is extended or adjusted under 35 U.S.C. 154(b) by 231 days.

(21) Appl. No.: 16/629,869

(22) PCT Filed: Jun. 20, 2018

(86) PCT No.: PCT/US2018/038614
§ 371 (c)(1),
(2) Date: Jan. 9, 2020

(87) PCT Pub. No.: WO2019/013939
PCT Pub. Date: Jan. 17, 2019

(65) Prior Publication Data
US 2021/0147631 A1 May 20, 2021

Related U.S. Application Data

(60) Provisional application No. 62/530,730, filed on Jul. 10, 2017.

(51) Int. Cl.
*C08G 75/045* (2016.01)
*H01L 21/768* (2006.01)
(Continued)

(52) U.S. Cl.
CPC ...... *C08G 75/045* (2013.01); *H01L 21/76802* (2013.01); *G03F 7/038* (2013.01); *G03F 7/094* (2013.01)

(58) Field of Classification Search
CPC . C08G 75/045; H01L 21/76802; H01L 29/04; H01L 29/7869; H01L 29/78636;
(Continued)

(56) References Cited

U.S. PATENT DOCUMENTS 5,858,624 A 1/1999 Chou et al.
2010/0253607 A1 10/2010 Shiozaki
(Continued)

FOREIGN PATENT DOCUMENTS

WO 2015/188992 A1 12/2015
WO 2017/034858 A1 3/2017

OTHER PUBLICATIONS

International Search Report dated Sep. 7, 2018, issued in related International Application No. PCT/US2018/038614.

*Primary Examiner* — Caleen O Sullivan
(74) *Attorney, Agent, or Firm* — McGuireWoods LLP

(57) ABSTRACT

Provided is a method for forming an organic planarization layer. The method includes forming lithographically-patterned arrays atop a substrate; disposing a thiol-based photocurable resin on to the lithographically-patterned arrays to form a photocurable planarization layer; and curing the photocurable planarization layer to form a flat surface above the lithographically-patterned array.

20 Claims, 5 Drawing Sheets

(51) Int. Cl.
G03F 7/038 (2006.01)
G03F 7/09 (2006.01)

(58) Field of Classification Search
CPC . H01L 29/66742; H01L 29/785; G03F 7/038; G03F 7/094
USPC .......................................................... 438/780
See application file for complete search history.

(56) References Cited

U.S. PATENT DOCUMENTS

| | | |
|---|---|---|
| 2014/0332760 A1 | 11/2014 | Nishimura et al. |
| 2014/0335448 A1 | 11/2014 | Sekito et al. |
| 2015/0064613 A1 | 3/2015 | Yokoyama et al. |
| 2016/0359054 A1 | 12/2016 | Fang et al. |
| 2017/0338254 A1 | 11/2017 | Reit et al. |
| 2018/0155500 A1* | 6/2018 | Reit ................... H01L 23/4985 |

* cited by examiner

PHOTOPATTERNED PLANARIZATION LAYERS FOR FLEXIBLE ELECTRONICS

BACKGROUND

Semiconductor devices such as integrated circuits can be prepared by means of mass-printing or thin-film deposition methods. A critical component that is fabricated in most semiconductor devices (e.g. display, sensor array, etc.) is a thin-film transistor (hereafter "TFT"). Under a typical semiconductor fabrication process, most layers of the semiconductor device are covered with a planarization layer that serves to remove topography before any following material deposition. The planarization should be patternable using photolithographic processes that can form connections between the various layers of the semiconductor device. The resulting surface should not have hills or valleys in the topography and possess a very smooth surface (i.e., Rq<0.5 nm)

Commercially available photopatternable planarization materials such as polyimides, acrylates, siloxanes, and polybenzocyclobutene are cured at very high temperatures in excess of 200° C., which requires significant time and energy input. UV-curable compositions, such as vinyl fluorine containing polymers, may have other issues. For example, their adhesion to the various layers in the semiconductor stack may be poor. Currently, a photopatternable planarization layer is desired that can be cured at low temperatures (<200° C.) and exhibit high adhesion to the variety of metals, ceramics, and other organics that may be used during fabrication steps. Preferably, said photopatternable planarization layer has low or zero outgassing.

BRIEF SUMMARY

Embodiments comprise the use of thiol-containing resin compositions as photopatternable planarization layers for use during semiconductor microfabrication. Through the selection of a resin that contains photosensitive initiators or catalysts, the resin may be initiated via a plurality of methods including photo- or thermally-initiated radical mechanisms, photo- or thermally-initiated anionic mechanisms, or photo- or thermally-initiated cationic mechanisms. As such, the resulting resins may be selectively exposed using a photomasking layer and subsequently hardened in the exposed areas. The unexposed areas can be further washed away to reveal the microstructure provided by the previous photomask, which may then be used as a planarization layer for a variety of semiconductor devices. In a preferred embodiment, the semiconductor devices are TFT's.

Traditional photopatternable layers rely on either UV-activated selective solubility of thermoplastic solutions (e.g., polyimides, polybenzocyclobutenes, etc.) or UV-curing of low-adhesion, oxygen-sensitive materials (e.g., acrylics, vinyl fluorines). By using thiol-containing resin compositions, the favorable UV-curing method of setting the polymer is chosen without having to further bake the photopatterned layer at elevated temperatures (>200° C.) or conduct the polymerization in oxygen-free atmospheres. Additionally, the favorable interaction between thiol moieties in the resin and the various metal, ceramic or other organic groups present at the surface of the semiconductor device may lead to a drastically increased adhesion when compared to other UV-cured resins.

The embodiments relate to a method for forming an organic planarization layer overlying an active-matrix transistor array. The method comprises forming the active-matrix transistor array atop a substrate; disposing a thiol-based photopatternable resin on the active-matrix transistor array to form a photopatternable planarization layer; and patterning the photopatternable planarization layer to open vias in the photopatternable planarization layer.

Additionally or alternatively, the method may include one or more of the following features individually or in combination: the thiol-based photopatternable resin may further comprise between about 0.001 wt. % and about 10 wt. % of an initiator, an inhibitor, a dye, a photobase generator, a photoacid generator, or any combination thereof. The multifunctional thiol monomer may be selected from the group consisting of: trimethylolpropane tris(3-mercaptopropionate); trimethylolpropane tris(2-mercaptoacetate); pentaerythritol tetrakis(2-mercaptoacetate); pentaerythritol tetrakis(3-mercaptopropionate); 2,2'-(ethylenedioxy) diethanethiol; 1,3-Propanedithiol; 1,2-ethanedithiol; 1,4-butanedithiol; tris[2-(3-mercaptopropionyloxy)ethyl] isocyanurate; 3,4-ethylenedioxythiophene; 1,10-decanedithiol; tricyclo[5.2.1.02,6]decanedithiol; benzene-1,2-dithiol; trithiocyanuric acid; dipentaerythritol hexakis(3-mercaptopropionate); 2,3-Di((2-mercaptoethyl)thio)-1-propanethiol; Dimercaptodiethylsulfide; Ethoxylated Trimethylpropan-tri(3-mercapto-propionate); Ethoxylated Trimethylpropantri(3-mercapto-propionate); Polycaprolactone tetra 3-mercaptopropionate; Di-Pentaerythritolhexakis (3-mercaptopropionate); Di-Trimethylolpropanetetra (3-mercaptopropionate); Glycoldi (3-mercaptopropionate); Pentaerythritoltetramercaptoacetate; Trimethylol-propanetri-mercaptoacetate; Glycoldi-mercaptoacetate; and any combination thereof. The multifunctional comonomer monomer may be selected from the group consisting of: 1,3,5-triallyl-1,3,5-triazine-2,4,6 (1H,3H,5H)-trione; tricyclo[5.2.1.02,6] decanedimethanol diacrylate; divinyl benzene; diallyl bisphenol A (diacetate ether); diallyl terephthalate; diallyl phthalate; diallyl maleate; trimethylolpropane diallyl ether; ethylene glycol dicyclopentenyl ether acrylate; diallyl carbonate; diallyl urea; 1,6-hexanediol diacrylate; cinnamyl cinnamate; vinyl cinnamate; allyl cinnamate; allyl acrylate; crotyl acrylate; cinnamyl methacrylate; trivinylcyclohexane; 1,4-cyclohexanedimethanol divinyl ether; poly (ethylene glycol) diacrylate; tricyclodecane dimethanol diacrylate; bisphenol A ethoxylate diacrylate; tris[2-(acryloyloxy ethyl)] isocyanurate; trimethylolpropane triacrylate; pentaethrytolpropane tetraacrylate; dipentaethrytolpropane penta-/hexa-acrylate; poly(ethylene glycol) dimethacrylate; dimethanol dimethacrylate; bisphenol A ethoxylate dimetharylate; trimethylolpropane trimethacrylate; pentaethrytolpropane tetramethacrylate; bisphenol A diglycidyl Ether; 4,4'-Methylenebis(N,N-diglycidylaniline); neopentyl glycol diglycidyl ether; tris(2,3-epoxypropyl) isocyanurate; trimethylolpropane triglycidyl ether i. 1,1'-(methylenedi-4,1-phenylene) bismaleimide; 1,6-di(maleimido) hexane; 1,4-di(maleimido)butane; N,N'-(1,3 phenylene) dimaleimide; isophorone diisocyanate; xylylene diisocyanate; tolylene diisocyanate; 1,4-diisocyanatobutane, 1,6-diisocyanatohexane, 1,8-diisocyanatooctane; vinyl norbornene; dicyclopentadiene; ethylidene norbornene; 1,3-Bis (2-isocyanato-2-propyl)benzene; 2,2-Bis(4-isocyanatophenyl)hexafluoropropane; 1,3-Bis(isocyanatomethyl)cyclohexane; Methylenediphenyl 4,4'-Diisocyanate; 3,3'-Dichloro-4,4'-diisocyanatobiphenyl; 4,4'-Diisocyanato-3,3'-dimethylbiphenyl; Dicyclohexylmethane 4,4'-Diisocyanate; 1,5-Diisocyanatonaphthalene; 1,3-Phenylene Diisocyanate; 1,4-Phenylene Diisocyanate; trimers thereof; and any combination thereof. The thiol-based photopatternable resin may comprise the initiator, and the initiator may be selected from the group consisting of: an organic peroxide, an inorganic peroxide, an azo-containing molecule, a benzophenone, a quinone, a thioxanthone, and any combination thereof. The thiol-based photopatternable resin may comprise the inhibitor, and the inhibitor may be selected from the group consisting of: a hindered phenolic molecule, a hindered amine molecule, a sulfide-containing molecule, a benzimidazole molecule, a phosphite-containing molecule, a benzotriazol molecule, a hydroxyphenol triazine molecule, and any combination thereof. The thiol-based photopatternable resin may comprise the dye, and the dye may be selected from the group consisting of: a xanthene, an azobenzene, an anthroquinone, a triphenylmethane, a thianaphthenone, a benzanthrone, a benzothiazole, a phenothiazine, a thianthrene, and any combination thereof. The thiol-based photopatternable resin may comprise the photobase generator, and the photobase generator may be selected from the group consisting of: a co(m)-amine and/or alkyl amine salt, an O-Acyloxime, a benzyloxycarbonyl derivative, a formamide, and any combination thereof. The thiol-based photopatternable resin may comprise the photoacid generator, and the photoacid generator may be selected from the group consisting of: an aryldiazonium salt, a diarylhalonium salt, a triarylsulfonium salt, a nitrobenzyl ester, a sulfone, a phosphate, a N-Hydroxyimide sulfonate, a sulfonic acid ester of phenol, a diazonaphthoquinone, a halogen-containing compound, an imino sulfonate, and any combination thereof. The thiol-based photopatternable resin may be made into a solution by diluting with up to about 99 wt. % solvent. The method may further comprise depositing additional layers atop the photopatternable planarization layer including, but not limited to, a conductive layer, an insulating layer, a semiconducting layer or any combination thereof.

BRIEF DESCRIPTION OF THE DRAWINGS

Illustrative examples of the present disclosure are described in detail below with reference to the attached drawing figures, which are incorporated by reference herein, and wherein.

DETAILED DESCRIPTION

Figure 1A:
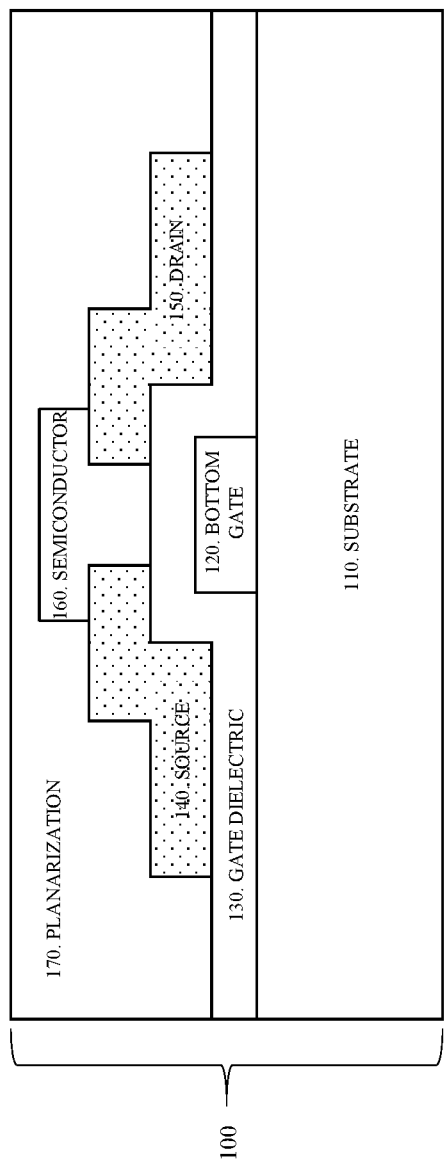
FIG. 1a is a bottom-gate thin-film transistor with a thiol-containing resin deposited atop the structure as a planarization layer.

The present disclosure relates to the method of using thiol-based resins as photopatternable interlayers during electronics microfabrication. In particular, the method comprises the fabrication of an active matrix array of transistors atop a substrate. Further, a thiol-based photopatternable layer is dispensed atop the array and photopatterned such that only the active electrical elements are exposed.

Photopatternable compositions have a variety of use in a microfabrication stack including photoresists used during the subtractive patterning of various thin-film layers (e.g., conductors, dielectrics, etc.), the direct photopatterning of thin-films in the microfabrication of organic electronics (e.g., photo-defined organic conductors, photo-defined organic dielectrics), or the photopatterning of organic interlayers in an inorganic stack (e.g., an interlayer dielectric, a planarization layer, etc.)

Of additional importance is the ability of these materials to be cured in ambient conditions (e.g., temperatures below 30° C., oxygen and moisture containing atmospheres, etc.) Most planarization layer polymers require significantly higher cure temperatures (e.g., polyimide cure schedules may reach 300° C. or greater, polybenzocyclobutene cure schedules may reach 200° C. or greater, etc.) and inert atmospheres (e.g., polyimides may require moisture-free conditions, acrylates may require oxygen-free conditions, etc.). Through the use of the thiol-containing resins presented herein, an insensitivity to oxygen and moisture is presented for curing. Additionally, by incorporating photosensitive moieties or photosensitive reaction initiators, the curing of the material can proceed at ambient temperatures via the use of photopatterning techniques currently employed in the exposure of the previously mentioned planarization layers. Other materials, such as fluorinated vinyl compositions, may require enhancement by further layers deposited between the planarization layer and the TFT structure to provide sufficient adhesion. In the case of thiol-containing planarization materials, no further adhesion layer needs to be introduced between the planarization layer and the TFT structure. This may reduce the overall complexity of the device fabrication process and lower the total time required for device completion.

These materials can also be employed as conformal planarization materials without a requirement for local patterning. In such applications, the thiol-containing resin composition is disposed on an array of lithographically-patterned features via a number of deposition techniques such as slot-die coating, spin coating, spray coating, or a combination thereof. The thiol-containing resin will then fill the empty space between adjacent lithographically-patterned features to form a planar surface where either the surface of the patterned features are flush with the surface of the thiol-containing resin, or the resin is thicker than features themselves. The thiol-containing resin can then be flood exposed to sources of actinitic radiation and cured to form a planarized layer for any further deposition of thin-films, such as gas barrier layers, transparent conductive oxides, or any combination thereof.

FIG. 1a illustrates a model bottom-gate active-matrix TFT structure 100 comprising a substrate 110 and the planarization layer 170, said planarization layer 170 formed using a thiol-containing resin. A substrate 110 is chosen for the TFT structure atop which a bottom gate electrode 120 is deposited and patterned. Said bottom gate electrode 120 is covered in a conformal gate dielectric 130. Next, source electrode 140 and drain electrode 150 are patterned from the following metallization step. A final deposition and patterning of the semiconductor layer 160 is completed. The model bottom-gate TFT structure 100 is then planarized by introducing a thiol-containing planarization resin atop the model bottom-gate TFT structure 100 via spin-coating, slot-die coating, or any other industrial resin deposition methodology to form the planarization layer.

Figure 1B:
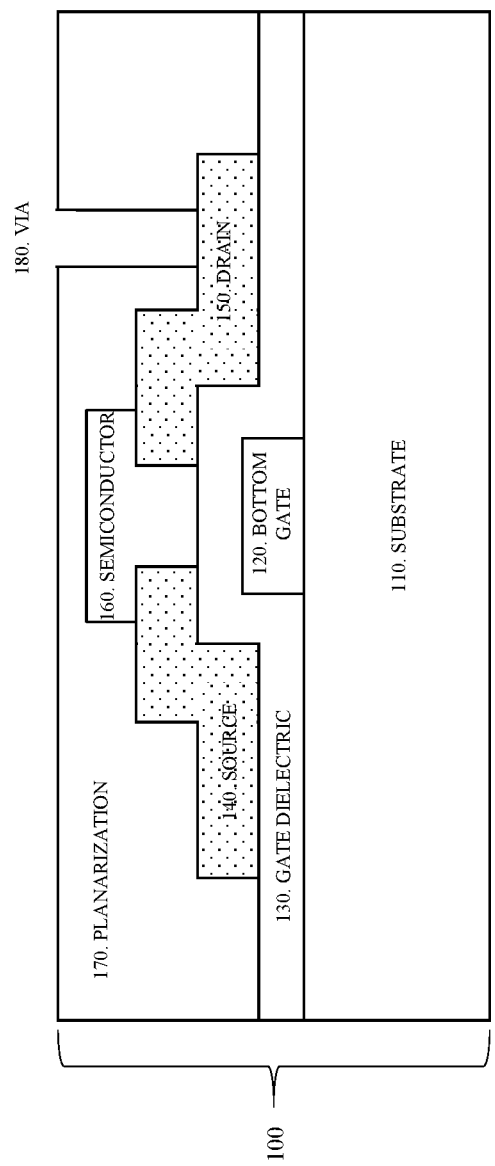
FIG. 1b is a bottom-gate thin-film transistor with a thiol-containing resin deposited atop the structure as a planarization layer, wherein the resin has been photopatterned to expose the drain electrode contact pad.

FIG. 1b shows that the planarization layer 170 can be further patterned to expose a via 180 to the drain electrode 150, allowing for contact to the model bottom-gate TFT structure 100 via the drain electrode 150 and bottom gate electrode 120 (contact point obscured by drain electrode 150 in FIG. 1b).

Figure 2A:
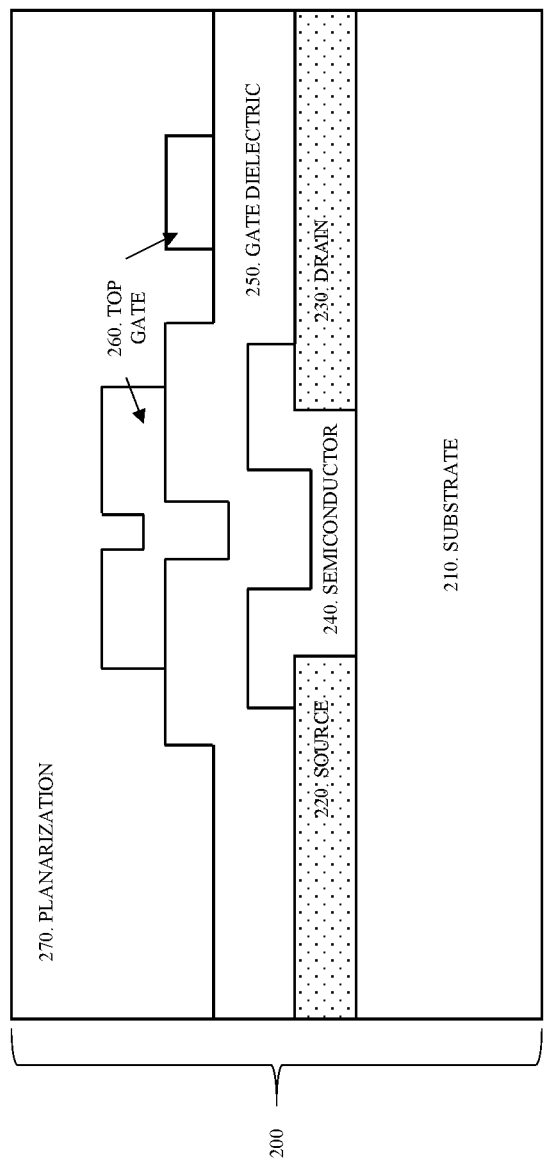
FIG. 2a is a top-gate thin-film transistor with a thiol-containing resin deposited atop the structure as a planarization layer.

FIG. 2a illustrates a model top-gate active-matrix TFT structure 200 comprising a substrate 210 and the planarization layer 270, said planarization layer 270 formed using a thiol-containing resin. A substrate 210 is chosen for the TFT structure atop which the source electrode 220 and the drain electrode 230 are patterned following a blanket metallization step. Next, a semiconductor layer 240 is deposited and patterned to overlap the source electrode 220 and drain electrode 230. The patterned semiconductor layer 240 and metal layers are then covered in a conformal gate dielectric 250. Next, the top gate electrode 260 metal is deposited and patterned. The model top-gate TFT structure 200 is then planarized by introducing a thiol-containing planarization resin atop the model top-gate TFT structure 200 via spin-coating, slot-die coating, or any other industrial resin deposition methodology to form the planarization layer 270.

Figure 2B:
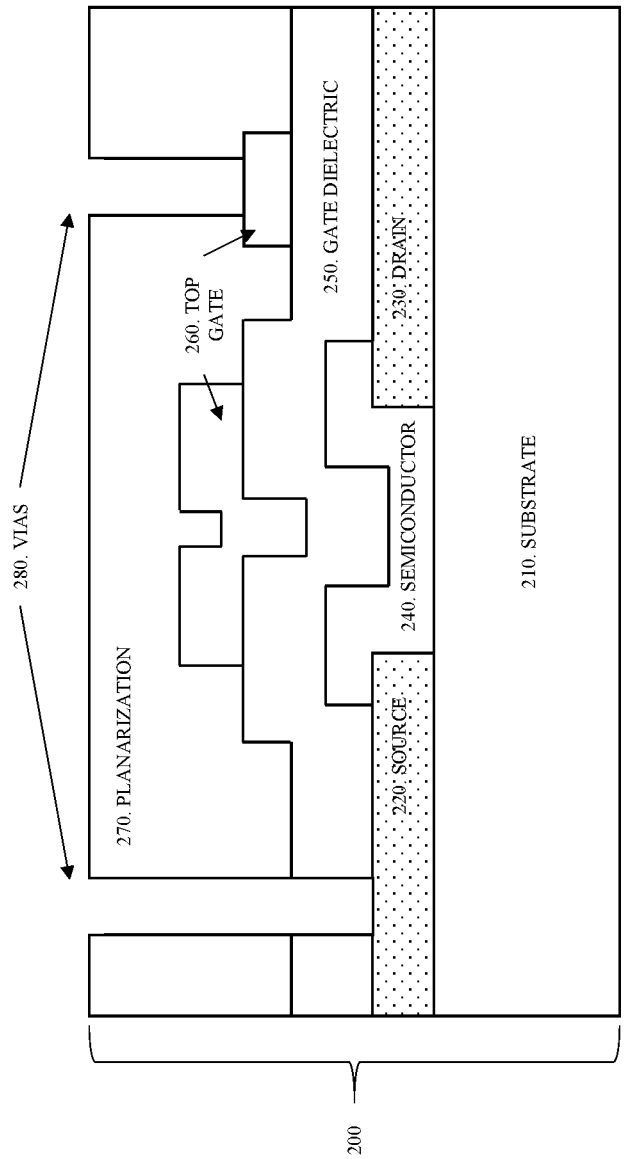
FIG. 2b is a top-gate thin-film transistor with a thiol-containing resin deposited atop the structure as a planarization layer, wherein the resin has been photopatterned to expose the top gate electrode pad and an area above the source electrode contact pad, which was further etched through the gate dielectric to contact said source electrode.

FIG. 2b shows that the planarization layer 270 can be further patterned to expose vias 280 to the source electrode 220 and top gate electrode 260, allowing for contact to the model top-gate TFT structure 200 via the source electrode 220 and top gate electrode 260.

Figure 3:
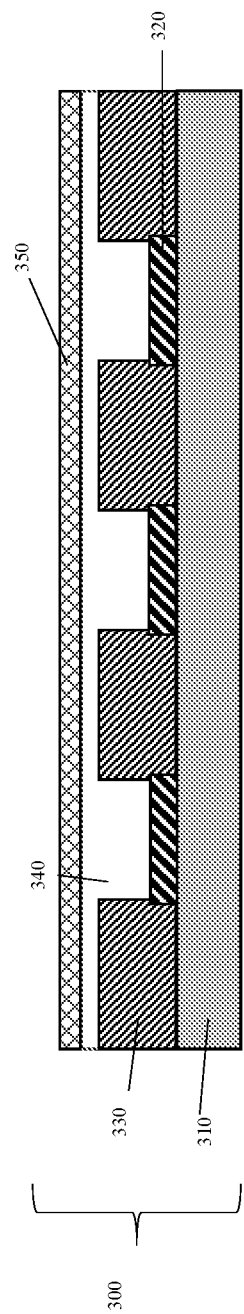
FIG. 3 shows a cross-sectional view of a color filter according to an embodiment.

FIG. 3 shows a cross-sectional view of a color filter 300, atop a substrate 310, a black matrix pattern 320 was deposited and patterned. Color filter pixels fabricated from patterned colored resists 330 were also deposited and patterned atop the substrate material 310. Next, a thiol-containing resin was deposited and cured as a planarization layer 340 atop the colored resist subpixels. Lastly, a transparent conductive layer 350 was deposited on the planarization layer 340.

In some embodiments, the thiol-containing resin comprises one or more multifunctional thiol monomers and one or more multifunctional comonomers.

Examples of the multifunctional thiol monomers may include, but are not limited to, trimethylolpropane tris(3-mercaptopropionate); trimethylolpropane tris(2-mercaptoacetate); pentaerythritol tetrakis(2-mercaptoacetate); pentaerythritol tetrakis(3-mercaptopropionate); 2,2'-(ethylenedioxy)diethanethiol; 1,3-propanedithiol; 1,2-ethanedithiol; 1,4-butanedithiol; tris[2-(3-mercaptopropionyloxy)ethyl] isocyanurate; 3,4-ethylenedioxythiophene; 1,10-decanedithiol; tricyclo[5.2.1.02,6]decanedithiol; benzene-1,2-dithiol; trithiocyanuric acid; dipentaerythritol hexakis(3-mercaptopropionate); 2,3-di((2-mercaptoethyl)thio)-1-propanethiol; dimercaptodiethylsulfide; ethoxylated trimethylpropan-tri(3-mercapto-propionate); ethoxylated trimethylpropantri(3-mercapto-propionate); polycaprolactone tetra 3-mercaptopropionate; di-Pentaerythritolhexakis (3-mercaptopropionate); di-Trimethylolpropanetetra (3-mercaptopropionate); glycoldi (3-mercaptopropionate); pentaerythritoltetramercaptoacetate; trimethylol-propanetrimercaptoacetate; and glycoldi-mercaptoacetate; any derivatives thereof, or any combination thereof.

Examples of the multifunctional comonomers may include, but are not limited to, 1,3,5-triallyl-1,3,5-triazine-2,4,6 (1H,3H,5H)-trione; tricyclo[5.2.1.02,6] decanedimethanol diacrylate; divinyl benzene; diallyl bisphenol A (diacetate ether); diallyl terephthalate; diallyl phthalate; diallyl maleate; trimethylolpropane diallyl ether; ethylene glycol dicyclopentenyl ether acrylate; diallyl carbonate; diallyl urea; 1,6-hexanediol diacrylate; cinnamyl cinnamate; vinyl cinnamate; allyl cinnamate; allyl acrylate; crotyl acrylate; cinnamyl methacrylate; trivinylcyclohexane; 1,4-cyclohexanedimethanol divinyl ether; poly(ethylene glycol) diacrylate; tricyclodecane dimethanol diacrylate; bisphenol A ethoxylate diarylate; tris[2-(acryloyloxy ethyl)] isocyanurate; trimethylolpropane triacrylate; pentaethrytolpropane tetraacrylate; dipentaethrytolpropane penta-/hexa-acrylate; poly(ethylene glycol) dimethacrylate; dimethanol dimethacrylate; bisphenol A ethoxylate dimetharylate; trimethylolpropane trimethacrylate; pentaethrytolpropane tetramethacrylate; bisphenol A diglycidyl Ether; 4,4'-Methylenebis(N,N-diglycidylaniline); neopentyl glycol diglycidyl ether; tris (2,3-epoxypropyl) isocyanurate; trimethylolpropane triglycidyl ether i. 1,1'-(methylenedi-4,1-phenylene) bismaleimide; 1,6-di(maleimido)hexane;

1,4-di(maleimido)butane; N,N'-(1,3 phenylene) dimaleimide; isophorone diisocyanate; xylylene diisocyanate; tolylene diisocyanate; 1,4-diisocyanatobutane, 1,6-diisocyanatohexane, 1,8-diisocyanatooctane; vinyl norbornene; dicyclopentadiene; ethylidene norbornene; 1,3-bis(2-isocyanato-2-propyl)benzene; 2,2-bis(4-isocyanatophenyl) hexafluoropropane; 1,3-bis(isocyanatomethyl)cyclohexane; methylenediphenyl 4,4'-Diisocyanate; 3,3'-dichloro-4,4'-diisocyanatobiphenyl; 4,4'-diisocyanato-3,3'-dimethylbiphenyl; dicyclohexylmethane 4,4'-diisocyanate; 1,5-diisocyanatonaphthalene; 1,3-phenylene siisocyanate; 1,4-phenylene diisocyanate; dimers thereof; trimers thereof; any derivatives thereof; or any combination thereof.

In some embodiments, the thiol-containing resin comprises from about 5 wt. % to about 95 wt. % of one or more multifunctional thiol monomers and from about 5 wt. % to about 95 wt. % of one or more multifunctional co-monomers. The concentration of the multifunctional thiol monomers or the multifunctional co-monomers may range from any lower limit to any upper limit and encompass any subset between the upper and lower limits. Some of the lower limits listed may be greater than some of the listed upper limits. One skilled in the art will recognize that the selected subset may require the selection of an upper limit in excess of the selected lower limit. Therefore, it is to be understood that every range of values is encompassed within the broader range of values. For example, the concentration of the multifunctional thiol monomers or the multifunctional co-monomers may be about 5 wt. % of the thiol-containing resin, 15 wt. % of the thiol-containing resin, 25 wt. % of the thiol-containing resin, 35 wt. % of the thiol-containing resin, 45 wt. % of the thiol-containing resin, 55 wt. % of the thiol-containing resin, 65 wt. % of the thiol-containing resin, 75 wt. % of the thiol-containing resin, 85 wt. % of the thiol-containing resin, or 95 wt. % of the thiol-containing resin. With the benefit of this disclosure, one of ordinary skill in the art will be able to obtain and prepare a thiol-containing resin for a given application.

In some embodiments, the thiol-containing resins may comprise one or more multifunctional thiol monomers with a molecular weight below 10,000 Da, and one or more multifunctional co-monomers with a molecular weight below 10,000 Da. The molecular weight of the multifunctional thiol monomers or the multifunctional co-monomers may range from any lower limit to any upper limit and encompass any subset between the upper and lower limits. Some of the lower limits listed may be greater than some of the listed upper limits. One skilled in the art will recognize that the selected subset may require the selection of an upper limit in excess of the selected lower limit. Therefore, it is to be understood that every range of values is encompassed within the broader range of values. For example, the molecular weight of the multifunctional thiol monomers or the multifunctional co-monomers may be about 10,000 Da, 9,000 Da, 8,000 Da, 7,000 Da, 6,000 Da, 5,000 Da, 4,000 Da, 3,000 Da, 2,000 Da, 1000 Da, 950 Da, 900 Da, 850 Da, 800 Da, 750 Da, 700 Da, 650 Da, 600 Da, 550 Da, 500 Da, 450 Da, 400 Da, 350 Da, 300 Da, 250 Da, 200 Da, 150 Da, or about 100 Da or lower. With the benefit of this disclosure, one of ordinary skill in the art will be able to obtain and prepare a thiol-containing resin for a given application.

In some embodiments, the resin may further comprise an initiator, an inhibitor, a dye, a photobase generator, or a photoacid generator. The initiator may include, but is not limited to, an organic peroxide (e.g., Dicumyl peroxide), an inorganic peroxide (e.g., Potassium persulfate), an azo-containing molecule (e.g., 2,2'-Azobis(2-methylpropionitrile)), a benzophenone (e.g., 2-Dimethoxy-2-phenylacetophenone), a quinone (e.g., 2-Acetoryanthraquinone), a thioxanthone (e.g., 10-Methylphenothiazine), or any combination thereof. The inhibitor may include, but is not limited to, a hindered phenolic molecule (e.g., 4-tert-Butylphenol), a hindered amine molecule (e.g., Bis(2,2,6,6-tetramethyl-4-piperidyl) sebacate), a sulfide-containing molecule (e.g., Didodecyl 3,3'-thiodipropionate), a benzimidazole molecule (e.g., 2-Phenyl-5-benzimidazole-sulfonic acid), a phosphite-containing molecule (e.g., Triisodecyl phosphite), a benzotriazol molecule (e.g., 2-(2H-Benzotriazol-2-yl)-6-dodecyl-4-methylphenol), a hydroxyphenol triazine molecule (e.g., 2-(4-Benzoyl-3-hydroxyphenoxy)ethyl acrylate), or any combination thereof. The dye may include, but is not limited to, a xanthene (e.g., 9H-xanthene), an azobenzene (e.g., 4-Amino-1,1'-azobenzene-3,4'-disulfonic acid monosodium salt), an anthroquinone (e.g., 1-methylamino anthraquinone), a triarylmethane (e.g., Methylrosanilinium chloride,), a thianaphthenone (e.g., 5,7-dichloro-3-(2H)-thianaphthenone), a benzanthrone (e.g., 1,9-benzanthrone), a benzothiazole (e.g., 2-(1H-1,2,3-triazol-1-yl)benzo[d]thiazole), a phenothiazine (e.g., methylthioninium chloride), a thianthrene (e.g., 9,10-Dithiaanthracene), or any combination thereof. The photobase generator may include, but is not limited to, a co(m)-amine and/or alkyl amine salt, an O-acyloxime, a benzyloxycarbonyl derivative, a formamide, or any combination thereof. The photoacid generator may be from the following families: an aryldiazonium salt, a diaryhalonium salt, a triarylsulfonium salt, a nitrobenzyl ester, a sulfone, a phosphate, a N-Hydroxyimide sulfonate, a sulfonic acid ester of phenol, a diazonaphthoquinone an imino sulfonate or any combination thereof.

In some embodiments, the substrate may include, but is not limited to, an inorganic material (e.g., glass, aluminum foil, stainless steel foil, etc.) or another organic film (e.g., polyethylene, polyethylene terephthalate, etc.).

In some embodiments, the thin-film transistor will be constructed using an inorganic stack (e.g., molybdenum or aluminum as source, drain, and gate electrodes; polycrystalline silicon or amorphous indium gallium zinc oxide as the semiconductor layer; silicon nitride or silicon oxide as the gate insulator), or using an organic stack (e.g., carbon black or poly(3,4-ethylenedioxythiophene) as the source, drain, and gate electrodes; dinaphtho[2,3-b:2',3'-f]thieno[3,2-b]thiophene or pentacene as the semiconductor; polymethylmethacrylate or polyvinyl phenol as the gate insulator). Combinations of organic and inorganic stack elements may also be used in some embodiments.

Optionally, the thiol-containing resin may be made into a solution by diluting the resin using solvents, such as polar protic solvents (e.g., water), polar aprotic solvents (e.g., acetone), or nonpolar solvents (e.g., chloroform).

The solvent fraction may comprise up to about 99 wt. % of the solution made with the thiol-containing resin. The solvent fraction may range from any lower limit to any upper limit and encompass any subset between the upper and lower limits. Some of the lower limits listed may be greater than some of the listed upper limits. One skilled in the art will recognize that the selected subset may require the selection of an upper limit in excess of the selected lower limit. Therefore, it is to be understood that every range of values is encompassed within the broader range of values. For example, the solvent fraction may comprise about 99 wt. %, about 95 wt. %, about 90 wt. %, about 80 wt. %, about 70 wt. %, about 60 wt. %, about 50 wt. %, about 40 wt. %, about 30 wt. %, about 20 wt. %, about 10 wt. %, about 5 wt. %, about 2 wt. %, about 1 wt. %, or lower of the solution made with the thiol-containing resin. With the benefit of this disclosure, one of ordinary skill in the art will be able to obtain and prepare a thiol-containing resin for a given application.

In some embodiments, the array of lithographically-defined structures may include thin-film transistors, light emitting diodes, color filter subpixels, or any combination thereof.

Example 1

Bottom-gate, inverted-staggered amorphous indium gallium zinc oxide (hereafter "a-IGZO") active-matrix TFTs were formed on a 6" Si wafer. Briefly, a gate electrode was formed by the deposition of a 200-nm-thick Mo layer and patterned by wet etch. Then 100 nm of silicon dioxide (hereafter "SiO2") was deposited as the gate dielectric by plasma-enhanced chemical vapor deposition (hereafter "PECVD"). A 50-nm-thick IGZO film was sputtered on gate insulator and etched to form active layer. The source and drain electrodes were formed by sputtering and lift-off processing a 100 nm Mo film. Atop said structure, 10.3 g of a negative-tone planarization resin comprised of 6.919 g trimethylolpropane tris(3-mercaptopropionate), 3.076 g 1,3,5-Triallyl-1,3,5-triazine-2,4,6(1H,3H,5H)-trione, 0.1 g 2,2-Dimethoxy-2-phenylacetophenone, 0.15 g 4-tert-Butylphenol, 0.02 g 1-methylamino anthraquinone, and 0.03 g Triphenylsulfonium triflate was dispensed. No adhesion layer was added for the planarization layer. The wafer was then spun at 2000 RPM for 120 seconds to disperse the planarization resin. Next, the wafer was placed in a commercial stepper where the resin was photopatterned using conventional semiconductor lithography. The resin was exposed to 300 mJ/cm$^2$ of 254 nm light to initiate the polymerization, yielding the final pattern. No inert atmospheres or elevated temperatures were used during the curing of the planarization resin. Unreacted components were washed away during a developing step wherein the entire wafer was submerged in an acetone bath for 30 seconds. The resulting surface is then suitable for electrode metallization (e.g. indium tin oxide, hereafter "ITO") and organic light emitting diode (hereafter "OLED") deposition and fabrication for active-matrix OLED (hereafter "AMO-LED") displays.

Example 2

Top-gate, inverted-staggered low-temperature polycrystalline silicon (hereafter "LTPS") active-matrix TFTs were formed on a Generation 2 mother glass panel (370 mm×470 mm). Briefly, a basecoat layer of 200 nm SiO2 was deposited via PECVD. Next, a 50-nm-thick a-Si film was deposited to form the active layer and further dehydrogenated at 450° C. Laser-induced crystallization was further performed to convert the a-Si film to a poly-Si film, which was further patterned using active mask lithography. An 80 nm SiO2 layer was then deposited via PECVD to form the gate insulator. A 100 nm Mo metal layer was deposited and patterned via mask lithography to form the gate. Next, a 1.5 um layer of Microposit S1813 photoresist was deposited, exposed and developed photolithographically for N-type ion implantation. The resist was then stripped and the process repeated for P-type ion implantation. After resist stripping, the stack was moved to a thermal annealing chamber at 500° C. for activation of the semiconductor. A 500 nm layer of SiO2 was further deposited as an interlayer dielectric. Contacts were opened via mask lithography to contact the gate, source, and drain electrode on the device. Atop said structure, 10.3 g of a negative-tone planarization resin comprised of 5.3631 g pentaerythritol tetrakis(3-mercaptopropionate), 4.6372 g 4,4'-Methylenebis(N,N-diglycidylaniline), 0.2 g Bis(2,2,6,6-tetramethyl-4-piperidyl) Sebacate, 0.05 g 1-methylamino anthraquinone, and 0.05 g N-Hydroxy-5-norbornene-2,3-dicarboximide perfluoro-1-butanesulfonate was dispensed. The wafer was then spun at 3500 RPM for 120 seconds to disperse the planarization resin. Next, the wafer was placed in a commercial stepper where the resin was photopatterned using conventional semiconductor lithography. The resin was exposed to 400 mJ/cm$^2$ of 305 nm light to initiate the polymerization, yielding the final pattern. No inert atmospheres or elevated temperatures were used during the curing of the planarization resin. Unreacted components were washed away during a developing step wherein the entire wafer was submerged in a propylene glycol methyl ether acetate bath for 30 seconds. The resulting surface is then suitable for electrode metallization (e.g. silver nanowire mesh) and OLED deposition and fabrication for AMOLED displays.

Example 3

Active-matrix TFTs (a-IGZO, LTPS, etc.) were formed on a substrate (e.g. 6" Si wafer, generation 2 mother glass, etc.). Atop said structure, 10.3 g of a negative-tone planarization resin comprised of 6.919 g trimethylolpropane tris(3-mercaptopropionate), 3.076 g 1,3,5-Triallyl-1,3,5-triazine-2,4,6 (1H,3H,5H)-trione, 0.1 g 2,2-Dimethoxy-2-phenylacetophenone, 0.15 g 4-tert-Butylphenol, 0.02 g 1-methylamino anthraquinone, and 0.03 g Triphenylsulfonium triflate was dispensed. The wafer was then spun at 2000 RPM for 120 seconds to disperse the planarization resin. Next, the wafer was placed in a commercial stepper where the resin was photopatterned using conventional semiconductor lithography. The resin was exposed to initiate the polymerization, yielding the final pattern. No inert atmospheres or elevated temperatures were used during the curing of the planarization resin. Unreacted components were washed away during a developing step wherein the entire wafer was submerged in an organic solvent bath. The resulting surface is then suitable for electrode metallization and OLED deposition and fabrication for AMOLED displays.

What is claimed is:
1. A method for forming an organic planarization layer overlying an active-matrix transistor array, the method comprises:
   forming the active-matrix transistor array atop a substrate;
   disposing a thiol-based photopatternable resin directly on the active-matrix transistor array, without any adhesion layer in between, to form a photopatternable planarization layer; and
   patterning the photopatternable planarization layer to open vias in the photopatternable planarization layer.
2. The method of claim 1, wherein the thiol-based photopatternable resin further comprises between about 0.001 wt. % and about 10 wt. % of an initiator, an inhibitor, a dye, a photobase generator, a photoacid generator, or any combination thereof.
3. The method of claim 1, wherein the multifunctional thiol monomer is selected from the group consisting of: trimethylolpropane tris(3-mercaptopropionate); trimethylolpropane tris(2-mercaptoacetate); pentaerythritol tetrakis(2-mercaptoacetate); pentaerythritol tetrakis(3-mercaptopropionate); 2,2'-(ethylenedioxy)diethanethiol; 1,3-Propanedithiol; 1,2-ethanedithiol; 1,4-butanedithiol; tris[2-(3-mercaptopropionyloxy)ethyl] isocyanurate; 3,4-ethylenedioxythiophene; 1,10-decanedithiol; tricyclo[5.2.1.02,6]decanedithiol; benzene-1,2-dithiol; trithiocyanuric acid; dipentaerythritol hexakis(3-mercaptopropionate); 2,3-Di((2-mercaptoethyl)thio)-1-propanethiol; Dimercaptodiethylsulfide; Ethoxylated Trimethylpropan-tri(3-mercapto-propionate); Ethoxylated Trimethylpropantri(3-mercaptopropionate); Polycaprolactone tetra 3-mercaptopropionate; Di-Pentaerythritolhexakis (3-mercaptopropionate); Di-Trimethylolpropanetetra (3-mercaptopropionate); Glycoldi (3-mercaptopropionate); Pentaerythritoltetramercaptoacetate; Trimethylol-propanetri-mercaptoacetate; Glycoldi-mercaptoacetate; and any combination thereof.
4. The method of claim 1, wherein the multifunctional comonomer monomer is selected from the group consisting of: 1,3,5-triallyl-1,3,5-triazine-2,4,6 (1H,3H,5H)-trione; tricyclo[5.2.1.02,6] decanedimethanol diacrylate; divinyl benzene; diallyl bisphenol A (diacetate ether); diallyl terephthalate; diallyl phthalate; diallyl maleate; trimethylolpropane diallyl ether; ethylene glycol dicyclopentenyl ether acrylate; diallyl carbonate; diallyl urea; 1,6-hexanediol diacrylate; cinnamyl cinnamate; vinyl cinnamate; allyl cinnamate; allyl acrylate; crotyl acrylate; cinnamyl methacrylate; trivinylcyclohexane; 1,4-cyclohexanedimethanol divinyl ether; poly (ethylene glycol) diacrylate; tricyclodecane dimethanol diacrylate; bisphenol A ethoxylate diacrylate; tris[2-(acryloyloxy ethyl)] isocyanurate; trimethylolpropane triacrylate; pentaethrytolpropane tetraacrylate; dipentaethrytolpropane penta-/hexa-acrylate; poly(ethylene glycol) dimethacrylate; dimethanol dimethacrylate; bisphenol A ethoxylate dimetharylate; trimethylolpropane trimethacrylate; pentaethrytolpropane tetramethacrylate; bisphenol A diglycidyl Ether; 4,4'-Methylenebis(N,N-diglycidylaniline); neopentyl glycol diglycidyl ether; tris(2,3-epoxypropyl) isocyanurate; trimethylolpropane triglycidyl ether i. 1,1'-(methylenedi-4,1-phenylene) bismaleimide; 1,6-di(maleimido) hexane; 1,4-di(maleimido)butane; N,N'-(1,3 phenylene) dimaleimide; isophorone diisocyanate; xylylene diisocyanate; tolylene diisocyanate; 1,4-diisocyanatobutane, 1,6-diisocyanatohexane, 1,8-diisocyanatooctane; vinyl norbornene; dicyclopentadiene; ethylidene norbornene; 1,3-Bis (2-isocyanato-2-propyl)benzene; 2,2-Bis(4-isocyanatophenyl)hexafluoropropane; 1,3-Bis(isocyanatomethyl)cyclohexane; Methylenediphenyl 4,4'-Diisocyanate; 3,3'-Dichloro-4,4'-diisocyanatobiphenyl; 4,4'-Diisocyanato-3,3'-dimethylbiphenyl; Dicyclohexylmethane 4,4'-Diisocyanate;

1,5-Diisocyanatonaphthalene; 1,3-Phenylene Diisocyanate; 1,4-Phenylene Diisocyanate; trimers thereof; and any combination thereof.

5. The method of claim 2, wherein the thiol-based photopatternable resin comprises the initiator; wherein the initiator is selected from the group consisting of: an organic peroxide, an inorganic peroxide, an azo-containing molecule, a benzophenone, a quinone, a thioxanthone, and any combination thereof.

6. The method of claim 2, wherein the thiol-based photopatternable resin comprises the inhibitor; wherein the inhibitor is selected from the group consisting of: a hindered phenolic molecule, a hindered amine molecule, a sulfide-containing molecule, a benzimidazole molecule, a phosphite-containing molecule, a benzotriazol molecule, a hydroxyphenol triazine molecule, and any combination thereof.

7. The method of claim 2, wherein the thiol-based photopatternable resin comprises the dye; wherein the dye is selected from the group consisting of: a xanthene, an azobenzene, an anthroquinone, a triphenylmethane, a thianaphthenone, a benzanthrone, a benzothiazole, a phenothiazine, a thianthrene, and any combination thereof.

8. The method of claim 2, wherein the thiol-based photopatternable resin comprises the photobase generator; wherein the photobase generator is selected from the group consisting of: a co(m)-amine and/or alkyl amine salt, an O-Acyloxime, a benzyloxycarbonyl derivative, a formamide, and any combination thereof.

9. The method of claim 2, wherein the thiol-based photopatternable resin comprises the photoacid generator; wherein the photoacid generator is selected from the group consisting of: an aryldiazonium salt, a diarylhalonium salt, a triarylsulfonium salt, a nitrobenzyl ester, a sulfone, a phosphate, a N-Hydroxyimide sulfonate, a sulfonic acid ester of phenol, a diazonaphthoquinone, a halogen-containing compound, an imino sulfonate, and any combination thereof.

10. The method of claim 1, wherein the thiol-based photopatternable resin is made into a solution by diluting with up to about 99 wt. % solvent.

11. The method of claim 1 further comprising depositing additional layers atop the photopatternable planarization layer including, but not limited to, a conductive layer, an insulating layer, a semiconducting layer or any combination thereof.

12. A method for forming an organic planarization layer, the method comprising:
forming an array of lithographically-defined structures atop a substrate;
disposing a thiol-based photocurable resin directly on the array lithographically-defined structures array, without any adhesion layer in between, to form a thiol-based photocurable planarization layer; and
curing the thiol-based photocurable planarization layer.

13. The method of claim 12, wherein the thiol-based photocurable resin further comprises between about 0.001 wt. % and about 10 wt. % of an initiator, an inhibitor, a dye, a photobase generator, a photoacid generator, or any combination thereof.

14. The method of claim 12, wherein the multifunctional thiol monomer is selected from the group consisting of: trimethylolpropane tris(3-mercaptopropionate); trimethylolpropane tris(2-mercaptoacetate); pentaerythritol tetrakis(2-mercaptoacetate); pentaerythritol tetrakis(3-mercaptopropionate); 2,2'-(ethylenedioxy)diethanethiol; 1,3-Propanedithiol; 1,2-ethanedithiol; 1,4-butanedithiol; tris[2-(3-mercaptopropionyloxy)ethyl] isocyanurate; 3,4-ethylenedioxythiophene; 1,10-decanedithiol; tricyclo[5.2.1.02,6]decanedithiol; benzene-1,2-dithiol; trithiocyanuric acid; dipentaerythritol hexakis(3-mercaptopropionate); 2,3-Di((2-mercaptoethyl)thio)-1-propanethiol; Dimercaptodiethylsulfide; Ethoxylated Trimethylpropan-tri(3-mercapto-propionate); Ethoxylated Trimethylpropantri(3-mercaptopropionate); Polycaprolactone tetra 3-mercaptopropionate; Di-Pentaerythritolhexakis (3-mercaptopropionate); Di-Trimethylolpropanetetra (3-mercaptopropionate); Glycoldi (3-mercaptopropionate); Pentaerythritoltetramercaptoacetate; Trimethylol-propanetri-mercaptoacetate; Glycoldi-mercaptoacetate; and any combination thereof.

15. The method of claim 12, wherein the multifunctional comonomer monomer is selected from the group consisting of: 1,3,5-triallyl-1,3,5-triazine-2,4,6 (1H,3H,5H)-trione; tricyclo[5.2.1.02,6] decanedimethanol diacrylate; divinyl benzene; diallyl bisphenol A (diacetate ether); diallyl terephthalate; diallyl phthalate; diallyl maleate; trimethylolpropane diallyl ether; ethylene glycol dicyclopentenyl ether acrylate; diallyl carbonate; diallyl urea; 1,6-hexanediol diacrylate; cinnamyl cinnamate; vinyl cinnamate; allyl cinnamate; allyl acrylate; crotyl acrylate; cinnamyl methacrylate; trivinylcyclohexane; 1,4-cyclohexanedimethanol divinyl ether; poly (ethylene glycol) diacrylate; tricyclodecane dimethanol diacrylate; bisphenol A ethoxylate diacrylate; tris[2-(acryloyloxy ethyl)] isocyanurate; trimethylolpropane triacrylate; pentaethrytolpropane tetraacrylate; dipentaethrytolpropane penta-/hexa-acrylate; poly(ethylene glycol) dimethacrylate; dimethanol dimethacrylate; bisphenol A ethoxylate dimetharylate; trimethylolpropane trimethacrylate; pentaethrytolpropane tetramethacrylate; bisphenol A diglycidyl Ether; 4,4'-Methylenebis(N,N-diglycidylaniline); neopentyl glycol diglycidyl ether; tris(2,3-epoxypropyl) isocyanurate; trimethylolpropane triglycidyl ether i. 1,1'-(methylenedi-4,1-phenylene) bismaleimide; 1,6-di(maleimido) hexane; 1,4-di(maleimido)butane; N,N'-(1,3 phenylene) dimaleimide; isophorone diisocyanate; xylylene diisocyanate; tolylene diisocyanate; 1,4-diisocyanatobutane, 1,6-diisocyanatohexane, 1,8-diisocyanatooctane; vinyl norbornene; dicyclopentadiene; ethylidene norbornene; 1,3-Bis (2-isocyanato-2-propyl)benzene; 2,2-Bis(4-isocyanatophenyl)hexafluoropropane; 1,3-Bis(isocyanatomethyl)cyclohexane; Methylenediphenyl 4,4'-Diisocyanate; 3,3'-Dichloro-4,4'-diisocyanatobiphenyl; 4,4'-Diisocyanato-3,3'-dimethylbiphenyl; Dicyclohexylmethane 4,4'-Diisocyanate; 1,5-Diisocyanatonaphthalene; 1,3-Phenylene Diisocyanate; 1,4-Phenylene Diisocyanate; trimers thereof; and any combination thereof.

16. The method of claim 13, wherein the thiol-based photocurable resin comprises the initiator, wherein the initiator is selected from the group consisting of: an organic peroxide, an inorganic peroxide, an azo-containing molecule, a benzophenone, a quinone, a thioxanthone, and any combination thereof.

17. The method of claim 13, wherein the thiol-based photocurable resin comprises the inhibitor, wherein the inhibitor is selected from the group consisting of: a hindered phenolic molecule, a hindered amine molecule, a sulfide-containing molecule, a benzimidazole molecule, a phosphite-containing molecule, a benzotriazol molecule, a hydroxyphenol triazine molecule, and any combination thereof.

18. The method of claim 13, wherein the thiol-based photocurable resin is made into a solution by diluting with up to about 99 wt. % solvent.

19. The method of claim 12, wherein the array of lithographically-defined structures may include thin-film transistors, light emitting diodes, color filter subpixels, or any combination thereof.

20. A method for forming an organic planarization layer overlying a color resist array, the method comprises:
- forming the color resist array atop a substrate; wherein the substrate comprises a glass panel;
- depositing a thiol-based photocurable resin atop the color filter array to form a photocurable planarization layer; wherein the thiol-based photocurable resin comprises a multifunctional thiol monomer comprising pentaerythritol tetrakis(3-mercaptopropionate) and a multifunctional comonomer comprising 1,3,5-triallyl-1,3,5-triazine-2,4,6 (1H,3H,5H)-trione, wherein the depositing comprises depositing by at least one of: slot-die coating method, spin-coating method, and spray coating method; and
- curing the thiol-based photocurable resin at ambient conditions, and atop the color filter array to form a conformal planarization layer.

* * * * *